(12) United States Patent
Nakajima

(10) Patent No.: US 9,087,857 B2
(45) Date of Patent: Jul. 21, 2015

(54) SEMICONDUCTOR DEVICE, METHOD OF MANUFACTURING THE SAME, AND POWER MODULE

(71) Applicant: Rohm Co., Ltd., Kyoto (JP)

(72) Inventor: Toshio Nakajima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/569,821

(22) Filed: Dec. 15, 2014

(65) Prior Publication Data

US 2015/0140754 A1   May 21, 2015

Related U.S. Application Data

(62) Division of application No. 13/339,072, filed on Dec. 28, 2011, now Pat. No. 8,921,925.

(30) Foreign Application Priority Data

Dec. 28, 2010   (JP) .................................. 2010-292107

(51) Int. Cl.
| | |
|---|---|
| H01L 21/336 | (2006.01) |
| H01L 29/66 | (2006.01) |
| H01L 21/265 | (2006.01) |

(52) U.S. Cl.
CPC ........ *H01L 29/66666* (2013.01); *H01L 21/265* (2013.01)

(58) Field of Classification Search
USPC .................... 257/327, 329, 376, 401; 438/268
See application file for complete search history.

(56) References Cited

U.S. PATENT DOCUMENTS

| | | | |
|---|---|---|---|
| 7,518,197 B2 | 4/2009 | Yamaguchi | |
| 8,492,829 B2 | 7/2013 | Nakajima | |
| 2011/0147829 A1 | 6/2011 | Nakajima | |
| 2011/0148337 A1 | 6/2011 | Yamada | |

FOREIGN PATENT DOCUMENTS

| | | |
|---|---|---|
| JP | H09-232326 A | 9/1997 |
| JP | 2008-211148 A | 9/2008 |
| JP | 2009-188177 A | 8/2009 |
| WO | WO-2010-024433 A1 | 3/2010 |

OTHER PUBLICATIONS

Office Action with English Translation issued on Oct. 8, 2014 by Japan Patent Office for corresponding application JP2010-292107.

*Primary Examiner* — Errol Fernandes
(74) *Attorney, Agent, or Firm* — Rabin & Berdo, P.C.

(57) ABSTRACT

A semiconductor device includes an n-type drain layer, an n-type base layer provided on the n-type drain layer, a p-type base layer and an n-type source layer partially formed in surface layer portions of the n-type base layer and the p-type base layer, respectively, a gate insulation film formed on a surface of the p-type base layer between the n-type source layer and the n-type base layer, a gate electrode formed on the gate insulation film facing the p-type base layer across the gate insulation film, a p-type column layer formed within the n-type base layer to extend from the p-type base layer toward the n-type drain layer, a depletion layer alleviation region arranged between the p-type column layer and the n-type drain layer and including first baryons converted to donors, a source electrode connected to the n-type source layer, and a drain electrode connected to the n-type drain layer.

14 Claims, 13 Drawing Sheets

First Baryons (H⁺) Irradiated

Second Baryons ($^3$He$^{++}$ or $^4$H$^{++}$) Irradiated

<Comparative Example 1>

<Comparative Example 2>

<Example>

First Baryons (H⁺) Irradiated

SEMICONDUCTOR DEVICE, METHOD OF MANUFACTURING THE SAME, AND POWER MODULE

CROSS-REFERENCE TO RELATED APPLICATION

This is a Divisional of U.S. application Ser. No. 13/339,072, filed on Dec. 28, 2011, and allowed on Sep. 3, 2014, the subject matter of which is incorporated herein by reference. The parent application Ser. No. 13/339,072 is based upon and claims the benefit of priority from Japanese Patent Application No. 2010-292107, filed on Dec. 28, 2010, the entire contents of which are incorporated herein by reference.

TECHNICAL FIELD

The present disclosure relates to a semiconductor device having a MISFET (Metal-Insulator-Semiconductor Field-Effect-Transistor) of a super junction structure and a method of manufacturing the same.

BACKGROUND

MISFETs used as switching elements in an inverter circuit or a power supply circuit are largely categorized into a planar type MISFET and a super junction type MISFET. The planar type MISFET includes, e.g., a drain layer, an n-type base layer arranged on the drain layer, a p-type base layer formed in a surface layer portion thereof, an $n^+$-type drain layer and an $n^+$-type source layer formed in a surface layer portion of the p-type base layer in a spaced-apart relationship with each other. A gate electrode is arranged to face a surface of the p-type base layer existing between the $n^+$-type source and the drain layer through a gate insulation film.

On the other hand, as disclosed in International Publication No. WO 2010/024433, the super junction type MISFET includes, in addition to the configurations of the planar type MISFET, a p-type column layer extending from the p-type base layer toward the drain layer. This structure helps reduce on-resistance and increase switching speed. One of the problems posed in the super junction type MISFET resides in that a reverse recovery time trr of a parasitic diode is long. The parasitic diode is formed by a p-n junction between the p-type base layer and the p-type column layer and the n-type base layer. In the super junction structure provided with the p-type column layer, a lot of carriers are stored in the p-type column layer. Therefore, when the parasitic diode is turned off, a large reverse recovery current attributable to the carriers flows for a relatively long period of time.

In a power module configured by serially connecting a high-side switching element and a low-side switching element, the reverse recovery current induces a through-current. Thus, the reverse recovery current flowing for a long period of time leads to an increased loss of energy. For example, if a large reverse recovery current flows through the parasitic diode of the low-side switching element while the high-side switching element is kept turned on, a large through-current is induced and, therefore, a loss of energy is increased.

International Publication No. WO 2010/024433 provides a solution to this problem. More specifically, in the invention of International Publication No. WO 2010/024433, a trap level (recombination level) is locally formed within an n-type base layer between a p-type column layer and an $n^+$-type drain layer by performing baryon irradiation, thereby shortening the reverse recovery time trr. The trap level is formed locally and is not formed in the p-n junction portion between the p-type base layer and the p-type column layer and the n-type base layer. Accordingly, a leak current is not increased during an off-time period.

Another problem inherent in the super junction type MISFET is the hard recovery of the parasitic diode. By the term "hard recovery," it is meant that a change of the reverse recovery current (di/dt) is fast. In the super junction type MISFET, depletion layers are expanded from not only the p-type base layer but also the p-type column layer when the parasitic diode is turned off. In particular, the depletion layer expanded from the p-type column layer rapidly joins the depletion layer expanded from another p-type column layer adjoining thereto and rapidly reaches the drain layer lying just below the depletion layer. For that reason, the current is changed sharply and the reverse recovery current is interrupted at a high speed. As a result, the reverse recovery current shows a steeply-varying large-amplitude oscillatory waveform (ringing). These reverse recovery characteristics (hard recovery characteristics) generate a lot of noise and may possibly cause an erroneous operation of a controller for supplying a control signal to the MISFET. In an inverter circuit, among others, for driving an inductive load such as an electric motor, the parasitic diode is turned on and off. Thus, the hard recovery characteristics at the time of turning off the parasitic diode become a problem.

The invention of International Publication No. 2010/024433 succeeds in shortening the reverse recovery time trr but fails to provide a solution to the hard recovery problem. Accordingly, problems remain unsolved when the invention is applied to a power module (a power module for driving an inductive load among others).

SUMMARY

The present disclosure provides some embodiments of a semiconductor device having a super junction structure and capable of alleviating hard recovery and a method of manufacturing the same.

According to one embodiment of the present disclosure, there is provided a semiconductor device, including: an n-type drain layer; an n-type base layer provided on the n-type drain layer; a p-type base layer partially formed in a surface layer portion of the n-type base layer; an n-type source layer partially formed in a surface layer portion of the p-type base layer, a gate insulation film formed on a surface of the p-type base layer between the n-type source layer and the n-type base layer; a gate electrode formed on the gate insulation film to face the p-type base layer between the n-type source layer and the n-type base layer across the gate insulation film; a p-type column layer formed within the n-type base layer to extend from the p-type base layer toward the n-type drain layer; a depletion layer alleviation region arranged between the p-type column layer and the n-type drain layer within the n-type base layer, the depletion layer alleviation region including first baryons converted to donors; a source electrode electrically connected to the n-type source layer; and a drain electrode electrically connected to the n-type drain layer.

In the semiconductor device, the p-type column layer extends toward the n-type drain layer, thereby forming a MISFET having a super junction structure. If the drain electrode is connected to an electric potential higher than the source electrode and if a control voltage higher than a threshold voltage is applied to the gate electrode, an inversion layer (channel) is formed near the surface of the p-type base layer. Thus, there is formed a current path extending through the drain electrode, the n-type drain layer, the n-type base layer, the inversion layer on the surface of the p-type base layer, the n-type source layer and the source electrode in the named order. If the control current is not applied to the gate electrode, the inversion layer is not formed and, therefore, the current path is blocked. The p-n junction between the p-type base layer and the n-type base layer and between the p-type column layer and the n-type base layer makes up a parasitic diode. A parasitic diode is kept in an on-state when a forward voltage is applied and kept in an off-state when a reverse voltage is applied. If the parasitic diode is turned off, a reverse recovery phenomenon occurs that carriers (holes) within the p-type base layer and the p-type column layer migrate toward the source electrode while carriers (electrons) within the n-type base layer and the n-type drain layer migrate toward the drain electrode. The current flowing at this time is a reverse recovery current. Due to the migration of the carriers, a depletion layer expands from the p-n junction and the parasitic diode comes into the off-state.

In the present disclosure, the depletion layer alleviation region is arranged between the p-type column layer and the n-type drain layer within the n-type base layer. The depletion layer alleviation region includes baryons converted to donors. The depletion layer alleviation region restrains a depletion layer from expanding toward the drain electrode, thereby reducing an expansion speed of the depletion layer when the parasitic diode is turned off. This reduces a changing speed of the reverse recovery current and, therefore, improves recovery characteristics. Accordingly, it is possible to provide a MISFET having a super junction structure, which is good in on-resistance and switching speed and superior in recovery characteristics.

In another embodiment of the present disclosure, the semiconductor device may further include a trap level region arranged within the n-type base layer, the trap level region including second baryons for forming a trap level. With this configuration, the trap level region including the second baryons for forming the trap level is formed within the n-type base layer. The carriers (electrons) migrating within the n-type base layer are trapped in the trap level region, thereby reducing the reverse recovery current. Accordingly, the recovery characteristics are improved by the depletion layer alleviation region while the reverse recovery time is shortened by the trap level region.

In yet another embodiment of the present disclosure, the depletion layer alleviation region may have a thickness greater than a thickness of the trap level region. If the trap level is widely distributed, a lot of trap levels (recombination centers) are likely to be formed in the p-n junction portion between the p-type column layer and/or the p-type base layer and the n-type base layer, and a leak current is likely to increase. Accordingly, in some embodiments the trap levels are locally distributed as far as possible within a limited range. On the other hand, the depletion layer alleviation region is formed within the n-type base layer over a relatively wide range in the area between the p-type column layer and the drain layer, thereby effectively reducing the expansion speed of the depletion layer and improving the recovery characteristics.

If relatively light baryons (e.g., protons) are irradiated on a semiconductor layer, the baryons entering the semiconductor layer are distributed over a relatively wide range. In contrast, if relatively heavy baryons (e.g., helium nuclei) are irradiated on the semiconductor layer, the baryons entering the semiconductor layer are distributed over a relatively narrow range depending on the kinetic energy thereof. Accordingly, the depletion layer alleviation region can be made thick and the trap level region can be made thin, by selecting the relatively light baryons as the first baryons for the formation of the depletion layer alleviation region and selecting the relatively heavy baryons as the second baryons for the formation of the trap level region.

In still another embodiment of the present disclosure, the second baryons may include one member selected from the group consisting of protons, $^3He^{++}$ and $^4He^{++}$. In still another embodiment of the present disclosure, the first baryons may include one member selected from the group consisting of protons, $^3He^{++}$ and $^4He^{++}$. In still another embodiment of the present disclosure, the first baryons may include protons. The conversion of protons to donors can be performed through heat treatment at a relatively low temperature (e.g., at 350 to 450 degrees Celsius) and, therefore, can be performed even after the formation of the source electrode or the drain electrode. Accordingly, the degree of freedom of the process gets higher. For example, if helium nuclei ($^3He^{++}$ or $^4He^{++}$) are used as the first baryons, the conversion to donors thereof requires heat treatment at a high temperature of about 500 degrees Celsius. In order for the electrodes not to be damaged by the heat treatment, it is therefore necessary to perform the heat treatment for the conversion to donors before the formation of the electrodes.

In still another embodiment of the present disclosure, the depletion layer alleviation region may include an area overlapping with the p-type column layer. In still another embodiment of the present disclosure, the depletion layer alleviation region may not include an area overlapping with the p-type column layer. In still another embodiment of the present disclosure, the depletion layer alleviation region may adjoin the p-type column layer (more particularly, the bottom surface of the p-type column layer). In still another embodiment of the present disclosure, the depletion layer alleviation region may be separated from the p-type column layer (more particularly, a bottom surface of the p-type column layer). In particular, in some embodiments a boundary of the depletion layer alleviation region coincides with or remains close (by a distance of, e.g., 10 μm or less) to the boundary of the p-type column layer. Accordingly, the speed at which the depletion layer expands from the p-type column layer can be reduced without eroding the p-type column layer.

In still another embodiment of the present disclosure, a power module, including: a high-side switching element formed of the semiconductor device described above; and a low-side switching element formed of the semiconductor device described above, the high-side switching element and the low-side switching element serially connected to each other. With this configuration, the high-side switching element and the low-side switching element are formed of the semiconductor device including the MISFET having a super junction structure. It is therefore possible to provide a power module enjoying a reduced power loss in the switching elements, thereby providing a power module enjoying increased power supply efficiency. In addition, the hard recovery occurring when the parasitic diodes of the switching elements are turned off is restrained. It is therefore possible to reduce the erroneous operation of the controller for supplying a control signal to the switching elements.

In still another embodiment of the present disclosure, the power module may further include three serial circuits in which the high-side switching element and the low-side switching element are serially connected to each other, the three serial circuits parallel-connected to one another. This makes it possible to form a three-phase bridge inverter circuit. Similarly, a single-phase bridge inverter circuit can be formed by parallel-connecting two serial circuits in which the high-side switching element and the low-side switching element are serially connected. In addition, a single serial circuit (half-bridge circuit) in which the high-side switching element and the low-side switching element are serially connected may be used as a unit of the power module.

In still another embodiment of the present disclosure, the power module may be used to supply a drive current to an alternating current electric motor. In an inverter circuit for driving an inductive load represented by an alternating current electric motor, the parasitic diode is turned on and off. Accordingly, the load drive can be satisfactorily controlled if the semiconductor device capable of reducing the hard recovery of the parasitic diode is used as a switching element.

In still another embodiment of the present disclosure, there is provided a method of manufacturing a semiconductor device, including: forming an n-type base layer on an n-type drain layer; partially forming a p-type base layer in a surface layer portion of the n-type base layer; partially forming an n-type source layer in a surface layer portion of the p-type base layer: forming a p-type column layer within the n-type base layer, the p-type column layer extending from the p-type base layer toward the n-type drain layer, forming a gate insulation film on a surface of the p-type base layer between the n-type source layer and the n-type base layer; forming a gate electrode on the gate insulation film to face the p-type base layer between the n-type source layer and the n-type base layer across the gate insulation film; forming a source electrode electrically connected to the n-type source layer; forming a drain electrode electrically connected to the n-type drain layer; and forming a depletion layer alleviation region between the p-type column layer and the n-type drain layer within the n-type base layer by irradiating first baryons at a rear surface side of the drain layer and then converting the first baryons to donors through heat treatment at a predetermined temperature.

In still another embodiment of the present disclosure, the method may further include; forming a trap level region within the n-type base layer by irradiating second baryons at the rear surface side of the drain layer.

In still another embodiment of the present disclosure, the depletion layer alleviation region and the trap level region may be formed such that the depletion layer alleviation region has a thickness greater than a thickness of the trap level region. As stated above, the depletion layer alleviation region can be made thick and the trap level region can be made thin, by selecting the relatively light baryons as the first baryons for the formation of the depletion layer alleviation region and selecting the relatively heavy baryons as the second baryons for the formation of the trap level region.

In still another embodiment of the present disclosure, the second baryons may include one member selected from the group consisting of protons, $^3He^{++}$ and $^4He^{++}$. In still another embodiment of the present disclosure, the first baryons may include one member selected from the group consisting of protons, $^3He^{++}$ and $^4He^{++}$. In still another embodiment of the present disclosure, the first baryons may include protons.

In still another embodiment of the present disclosure, the depletion layer alleviation region may be formed to have an area overlapping with the p-type column layer. In still another embodiment of the present disclosure, the depletion layer alleviation region may be formed not to have an area overlapping with the p-type column layer. In still another embodiment of the present disclosure, the depletion layer alleviation region may be formed to adjoin the p-type column layer (more particularly, a bottom surface of the p-type column layer).

In still another embodiment of the present disclosure, the depletion layer alleviation region may be formed to be separated from the p-type column layer (more particularly, the bottom surface of the p-type column layer).

DETAILED DESCRIPTION

Figure 1:
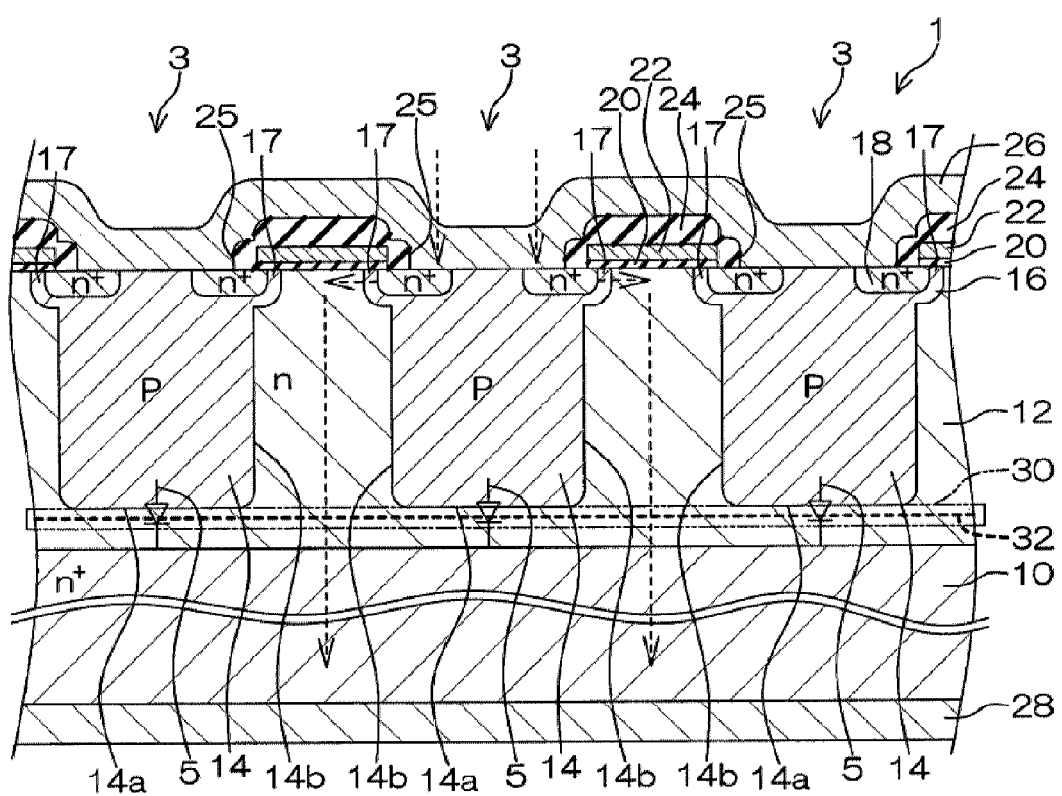
FIG. 1 is a section view for explaining a configuration of a semiconductor device according to one embodiment of the present disclosure.
Figure 2:
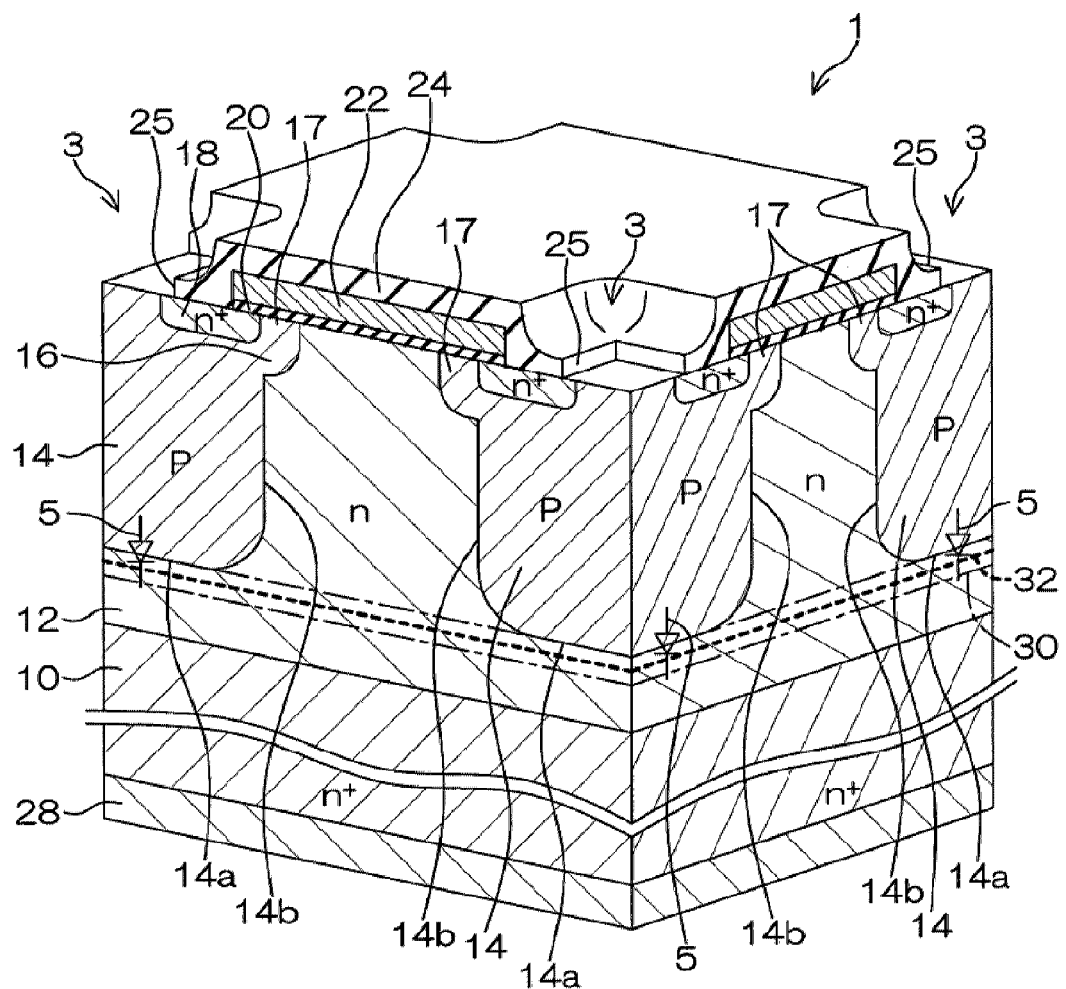
FIG. 2 is a perspective view of the semiconductor device illustrating sectional structures on two orthogonal cutting planes.

Certain embodiments of the present disclosure will now be described in detail with reference to the accompanying drawings. FIG. 1 is a section view for explaining the configuration of a semiconductor device according to one embodiment of the present disclosure. FIG. 2 is a perspective view of the semiconductor device illustrating the sectional structures on two orthogonal cutting planes. The semiconductor device 1 is an n-channel type MISFET having a super junction structure. More specifically, the semiconductor device 1 includes an $n^+$-type drain layer 10, an n-type base layer 12, a p-type column layer 14, a p-type base layer 16, an $n^+$-type source layer 18, a gate insulation film 20, a gate electrode 22, a source electrode 26 (not shown in FIG. 2), a drain electrode 28, a depletion layer alleviation region 30 and a trap level region 32. An interlayer insulation film 24 is arranged on the gate electrode 22.

The $n^+$-type drain layer 10 may be formed of an $n^+$-type semiconductor substrate (e.g., a silicon substrate). The $n^+$-type semiconductor substrate may be a semiconductor substrate obtained by causing crystal growth while doping an n-type impurity. As the n-type impurity, it is possible to use P (phosphor), As (arsenic), Sb (antimony), etc. The n-type base layer 12 is a semiconductor layer doped with the n-type impurity. More specifically, the n-type base layer 12 may be an n-type epitaxial layer which is caused to epitaxially grow while doping an n-type impurity. As the n-type impurity, it is possible to use the substances stated above.

Figure 3:
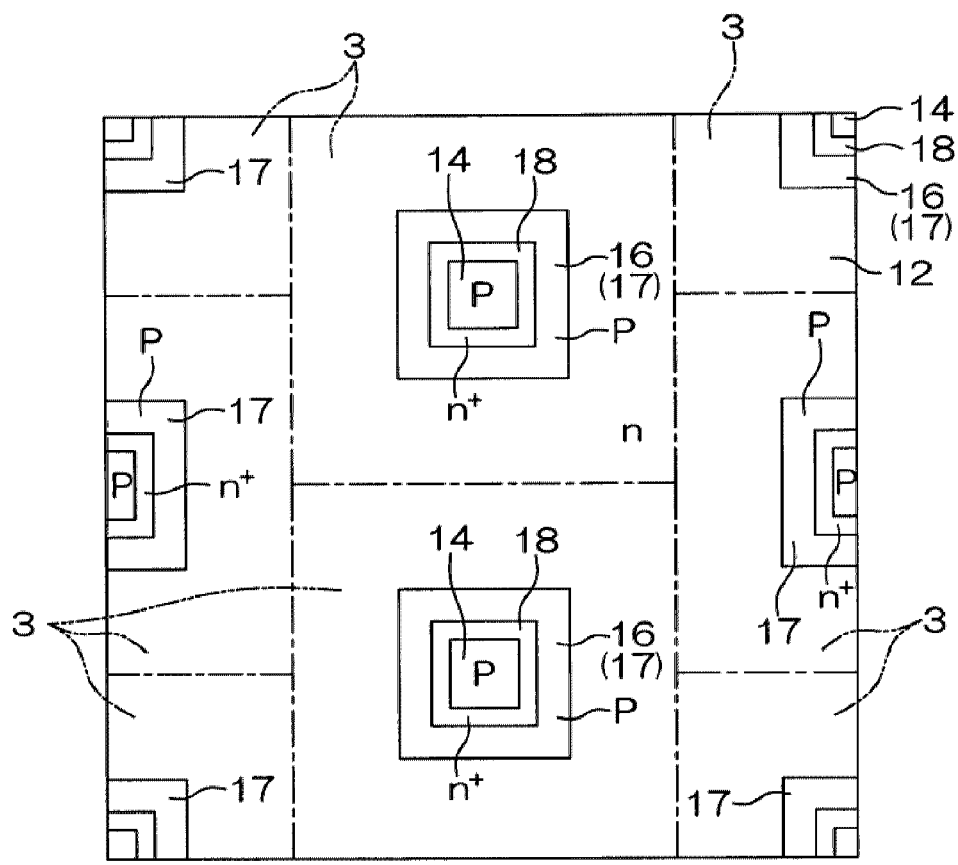
FIG. 3 is a plan view showing one example of a plan layout of semiconductor layers.
Figure 4:
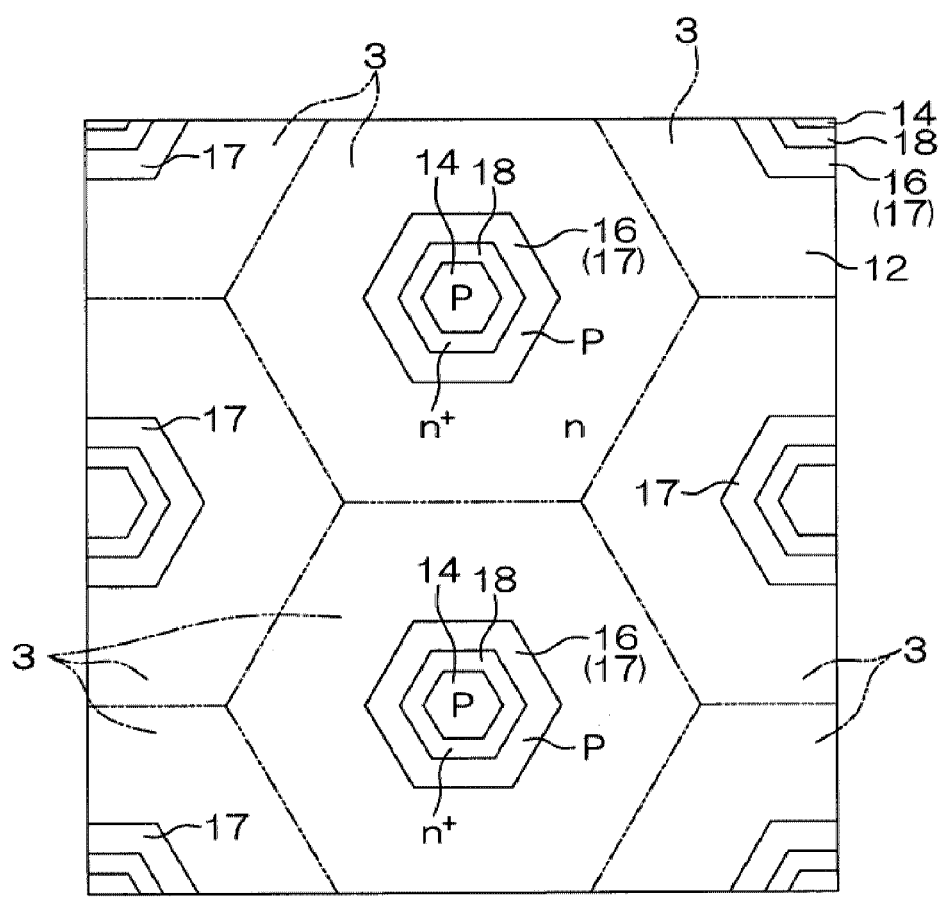
FIG. 4 is a plan view showing another example of a plan layout of semiconductor layers.

The p-type column layer 14 and the p-type base layer 16 are semiconductor layers doped with a p-type impurity. More specifically, the p-type column layer 14 and the p-type base layer 16 may be semiconductor layers formed by ion-implanting the p-type impurity into the n-type base layer 12. As the p-type impurity, it is possible to use B (boron). Al (aluminum). Ga (gallium), etc. The p-type base layer 16 is selectively formed in a surface layer portion of the n-type base layer 12 over a plurality of regions periodically arranged when the semiconductor device 1 is seen in a plan view. For example, as shown in a plan view of FIG. 3, p-type base layers 16 having a rectangular shape may be arranged in a staggering lattice pattern. Alternatively, as shown in a plan view of FIG. 4, p-type base layers 16 having a hexagonal shape may be arranged in a staggered lattice pattern. A region including each of the p-type base layers 16 and each of the n-type base layers 12 arranged around the p-type base layers 16 makes up a cell 3. In other words, the semiconductor device 1 includes a plurality of cells 3 arranged in a reticular shape when seen in a plan view.

The p-type column layer 14, when seen in a plan view, is formed in a region existing in the p-type base layer 16 of each of the cells 3. More specifically, in the present embodiment, the p-type column layer 14 is formed in a substantially central region of the p-type base layer 16, when seen in a plan view, to have, e.g., a shape similar to the shape of the p-type base layer 16 (a substantially rectangular plan-view shape in the layout of FIG. 3 or a hexagonal plan-view shape in the layout of FIG. 3). The p-type column layer 14 is formed to adjoin the p-type base layer 16. In the n-type base layer 12, the p-type column layer 14 extends toward the $n^+$-type drain layer 10 to reach a position deeper than the p-type base layer 16. In other words, the p-type column layer 14 is formed into a substantially columnar shape (a substantially rectangular columnar shape in the layout of FIG. 3 or a substantially hexagonal columnar shape in the layout of FIG. 4). A bottom surface 14a of the p-type column layer 14 (a boundary surface of the p-type column layer 14 meeting with the n-type base layer 12) is arranged in a position closer to the $n^+$-type drain layer 10 than the center of the p-type column layer 14 in a thickness direction of the n-type base layer 12. The bottom surface 14a of the p-type column layer 14 is opposed to a surface of the $n^+$-type drain layer 10 (an upper surface of the $n^+$-type drain layer 10 in FIGS. 1 and 2) with the n-type base layer 12 disposed therebetween in the thickness direction. A side surface 14b of the p-type column layer 14 (a boundary surface of the p-type column layer 14 meeting with the n-type base layer 12) is opposed to a side surface 14b of another adjoining p-type column layer 14 across the n-type base layer 12.

The boundary surface between the p-type base layer 16 and the p-type column layer 14 and the n-type base layer 12 is a p-n junction surface making up a parasitic diode (body diode) 5. An $n^+$-type source layer 18, when seen in a plan view, is formed in a region existing in the p-type base layer 16 of each cell 3. In this region, the $n^+$-type source layer 18 is selectively formed in the surface layer portion of the p-type base layer 16. The $n^+$-type source layer 18 may be formed by selectively ion-implanting an n-type impurity into the p-type base layer 16. Examples of the n-type impurity include the substances stated above. The $n^+$-type source layer 18 is formed within the p-type base layer 16 to lie in a position inwardly spaced apart by a specified distance from the boundary surface between the p-type base layer 16 and the n-type base layer 12. In the surface layer regions of the semiconductor layers including the n-type base layer 12 and the p-type base layer 16, therefore, the surface layer portion of the p-type base layer 16 is interposed between the $n^+$-type source layer 18 and the n-type base layer 12. The surface layer portion thus interposed provides a channel region 17. In the present embodiment, the $n^+$-type source layer 18 is formed into an annular plan-view shape (a rectangular ring shape in the layout of FIG. 3 or a hexagonal ring shape in the layout of FIG. 4). The $n^+$-type source layer 18, when seen in a plan view, is formed in a region straddling the inside and the outside of the side surface 14b of the p-type column layer 14. The channel region 17 has an annular plan-view shape (a rectangular ring shape in the layout of FIG. 3 or a hexagonal ring shape in the layout of FIG. 4) conforming to the shape of the $n^+$-type source layer 18.

The gate insulation film 20 may be made of, e.g., a silicon oxide film, a silicon nitride film, a silicon oxynitride film, hafnium oxide film, an alumina film or a tantalum oxide film. The gate insulation film 20 is formed to cover at least a surface of the p-type base layer 16 of the channel region 17. In the present embodiment, the gate insulation film 20 is formed to cover a portion of the $n^+$-type source layer 18, the channel region 17 and a surface of the n-type base layer 12. More precisely, the gate insulation film 20 is formed in such a pattern as to have an opening in a central region of the p-type base layer 16 of each cell 3 and in an inner edge region of the $n^+$-type source layer 18 adjoining the central region.

The gate electrode 22 is formed to face the channel region 17 with the gate insulation film 20 interposed therebetween. The gate electrode 22 may be made of, e.g., polysilicon whose resistance is reduced by doping an impurity. In the present embodiment, the gate electrode 22 is formed substantially in the same pattern as the gate insulation film 20 to cover a surface of the gate insulation film 20. In other words, the gate electrode 22 is arranged above the portion of the $n^+$-type source layer 18, the channel region 17 and the surface of the n-type base layer 12. More precisely, the gate electrode 22 is formed in such a pattern as to have an opening in the central region of the p-type base layer 16 of each cell 3 and in the inner edge region of the $n^+$-type source layer 18 adjoining the central region. That is to say, the gate electrode 22 is formed to simultaneously control the plurality of cells 3.

The interlayer insulation film 24 is made of an insulating material, e.g., a silicon oxide film, a silicon nitride film or a TEOS (tetraethoxysilane) film. The interlayer insulation film 24 covers upper and side surfaces of the gate electrode 22. The interlayer insulation film 24 is formed in such a pattern as to have a contact hole 25 in the central region of the p-type base layer 16 of each cell 3 and in the inner edge region of the $n^+$-type source layer 18 adjoining the central region. The source electrode 26 is made of aluminum or other metals. The source electrode 26 covers a surface of the interlayer insulation film 24 and is formed to fill the contact hole 25 of each cell 3. Thus, the source electrode 26 is ohmic-connected to the $n^+$-type source layer 18. Accordingly, the source electrode 26 is parallel-connected to the plurality of cells 3 and is configured so that a total current flowing in the plurality of cells 3 can flow through the source electrode 26. The source electrode 26 is ohmic-connected to the p-type base layer 16 of each cell 3 through the contact hole 25, thereby stabilizing an electric potential of the p-type base layer 16.

The drain electrode 28 is made of aluminum or other metals. The drain electrode 28 is formed on a rear surface of the $n^+$-type drain layer 10 (an opposite surface of the $n^+$-type drain layer 10 from the n-type base layer 12, i.e., a lower surface of the $n^+$-type drain layer 10 in FIGS. 1 and 2). Thus, the drain electrode 28 is parallel-connected to the plurality of cells 3 and is configured so that a total current flowing in the plurality of cells 3 can flow through the drain electrode 28. If a direct current source is connected between the source electrode 26 and the drain electrode 28 with an electric potential of the drain electrode 28 kept high and an electric potential of the source electrode 26 kept low, a reverse bias is applied to the parasitic diode 5. At this time, if a control voltage lower than a predetermined threshold voltage is applied to the gate electrode 22, no current path is formed between the drain electrode 28 and the source electrode 26. That is to say, the semiconductor device 1 is kept in an off-state. On the other hand, if a control voltage greater than the predetermined threshold voltage is applied to the gate electrode 22, electrons are gathered on the surface of the channel region 17 and an inversion layer (channel) is formed on the surface of the channel region 17. Thus, electric conduction is made between the $n^+$-type source layer 18 and the n-type base layer 12. In other words, there is formed a current path extending from the source electrode 26 to the drain electrode 28 through the $n^+$-type source layer 18, the inversion layer of the channel region 17, the n-type base layer 12 and the $n^+$-type drain layer 10 in the named order. Thus, the semiconductor device 1 is kept in an on-state. In FIG. 1, the current path corresponding to the central cell 3 is indicated by a broken-line arrow.

When the semiconductor device 1 is applied to an inverter circuit for driving an inductive load such as an electric motor, it is sometimes the case that the source electrode 26 becomes higher in electric potential than the drain electrode 28 and the parasitic diode 5 gets turned on, thereby allowing a current to flow through the parasitic diode 5. Thereafter, if the source electrode 26 becomes lower in electric potential than the drain electrode 28, the parasitic diode 5 goes into a reverse bias state and gets turned off. At this turning-off time, a depletion layer is expanded from the p-n junction portion of the parasitic diode 5. Thus, carriers (positive holes) within the p-type base layer 16 and the p-type column layer 14 migrate toward the source electrode 26, and carriers (electrons) within the n-type base layer 12 migrate toward the drain electrode 28. Due to this migration of the carriers, a current flows in an opposite direction to the current flowing direction when the parasitic diode 5 is in an on-state. This current is called a reverse recovery current. The reverse recovery current is initially increased and then decreased. The time required for an intensity of the reverse recovery current to decrease to 10% of a maximum value after a forward current of the diode becomes zero is called a reverse recovery time. If a change of the reverse recovery current (di/dt) is great, vibration (ringing) may sometimes occur until the current converges to zero. These recovery characteristics are called hard recovery which may cause noise and erroneous operations.

The trap level region 32 assists in shortening the reverse recovery time. The depletion layer alleviation region 30 helps alleviate the hard recovery.

Figure 5:
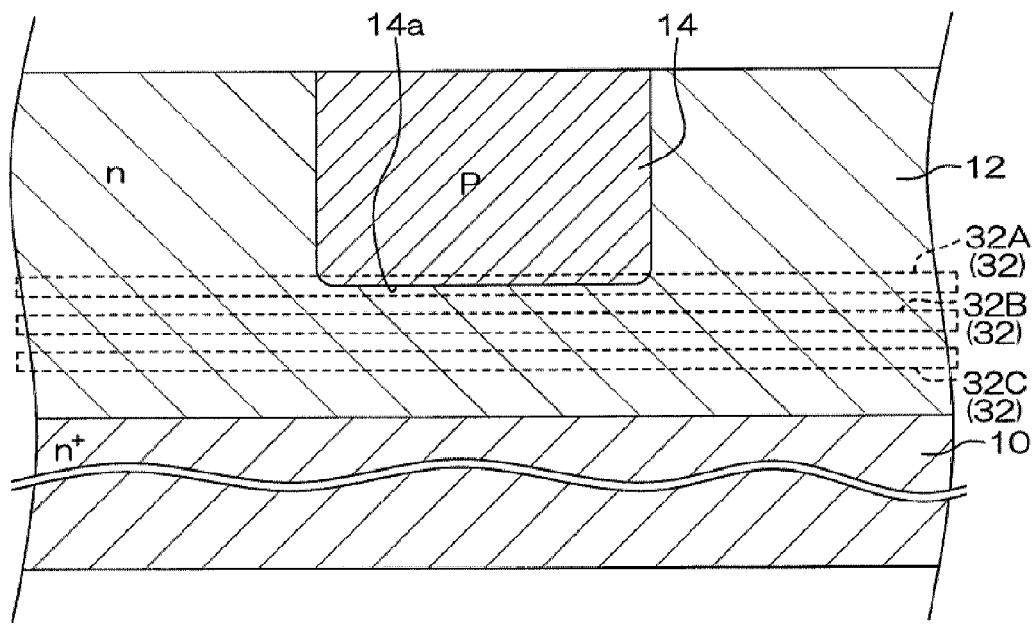
FIG. 5 is a section view for explaining an arrangement of a trap level region.

FIG. 5 is a section view for explaining an arrangement of the trap level region 32. The trap level region 32 is a region formed by irradiating baryons at the side of the drain layer 10. In the trap level region 32, there exist a lot of recombination centers where the carriers are trapped, recombined and extinguished. This makes it possible to rapidly extinguish the carriers when the parasitic diode 5 is turned off. Accordingly, it is possible to reduce the reverse recovery time and the reverse recovery current.

The trap level region 32 is locally formed to expand in a thin thickness (e.g., about 1 μm to 3 μm) at a predetermined depth position from the rear surface of the drain layer 10 (the boundary surface of the drain layer 10 meeting with the drain electrode 28). The trap level region 32 may adjoin the p-type column layer 14 as indicated by reference symbol 32A or may be positioned between the bottom surface 14a of the p-type column layer 14 and the drain layer 10 without adjoining the p-type column layer 14 as indicated by reference symbols 32B and 32C. The reference symbol 32B indicates an instance where a thickness direction center position of the trap level region 32 is closer to the bottom surface 14a of the p-type column layer 14 than a middle position between the bottom surface 14a of the p-type column layer 14 and the surface of the drain layer 10. The reference symbol 32C indicates an instance where the thickness direction center position of the trap level region 32 is closer to the drain layer 10 than the middle position between the bottom surface 14a of the p-type column layer 14 and the surface of the drain layer 10. It is effective in shortening the reverse recovery time if the trap level region 32 is positioned close to the bottom surface 14a of the p-type column layer 14, while it is effective in reducing the drain-source leak current if the trap level region 32 is positioned far away from the bottom surface 14a of the p-type column layer 14. In order to reduce the reverse recovery time and the drain-source leak current, in some embodiments the thickness direction center position of the trap level region 32 lies within a range of 5 μm to 10 μm from the bottom surface 14a of the p-type column layer 14 toward the drain layer 10. This makes it possible to reduce the reverse recovery time to 80 nanoseconds or less and to reduce the drain-source leak current to several μA or less.

When forming the trap level region 32, it is possible to adopt irradiation of baryons such as protons, $^3He^{++}$ and $^4He^{++}$. Among them, the helium nuclei ($^3He^{++}$ or $^4He^{++}$) having a large mass are preferred because the helium nuclei are capable of narrowing a thickness-direction distribution band of the recombination centers and capable of locally distributing the recombination centers within a narrow range in the thickness direction.

Figure 6:
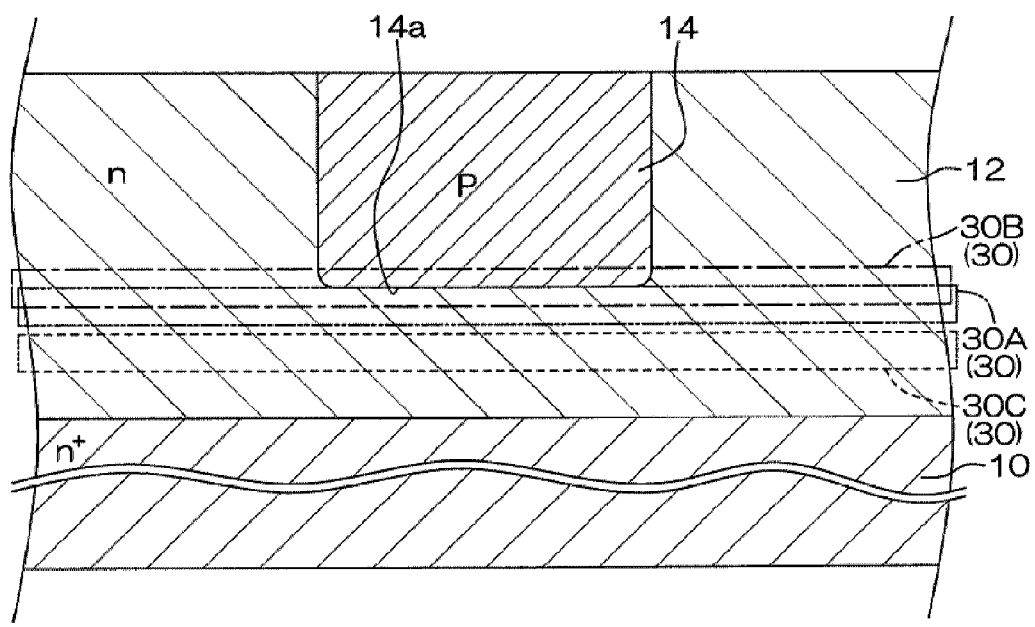
FIG. 6 is a section view for explaining an arrangement of a depletion layer alleviation region.

FIG. 6 is a section view for explaining an arrangement of the depletion layer alleviation region 30. The depletion layer alleviation region 30 is a region formed by irradiating baryons at the side of the drain layer 10 and converting the baryons to donors though heat treatment. The baryons converted to donors restrain a depletion layer from expanding from the p-n junction portion when the parasitic diode 5 is turned off. As a result, an expansion speed of the depletion layer is reduced, which makes it possible to reduce a changing speed of the reverse recovery current and, consequently, to alleviate the hard recovery.

The depletion layer alleviation region 30 is formed to expand in a thickness direction (with a thickness of, e.g., about 5 μm to 10 μm, which is thicker than the trap level region 32) at a predetermined depth position from the rear surface of the drain layer 10 (the boundary surface of the drain layer 10 meeting with the drain electrode 28). The depletion layer alleviation region 30 may be contiguous to the p-type column layer 14 as indicated by reference symbols 30A and 30B or may not be contiguous to the p-type column layer 14 as indicated by reference symbol 30C. In addition, the depletion layer alleviation region 30 may have an area overlapping with the p-type column layer 14 as indicated by the reference symbol 30B. Alternatively, the entire depletion layer alleviation region 30 may be positioned between the bottom surface 14a of the p-type column layer 14 and the surface of the drain layer 10 with no area overlapping with the p-type column layer 14 as indicated by the reference symbols 30A and 30C. Since the depletion layer alleviation region 30 is a region including donors, in some embodiments, in order not to impair the function of the p-type column layer 14, the area overlapping with the p-type column layer 14 is made to be as narrow as possible. With a view to alleviate the expansion of the depletion layer, in some embodiments the depletion layer alleviation region 30 should be close to the p-type column layer 14. It is therefore, in some embodiments, preferable to select the arrangement of the depletion layer alleviation region 30 so that, as indicated by the reference symbol 30A, an upper edge of the depletion layer alleviation region 30 be substantially flushed with the bottom surface 14a of the p-type column layer 14.

When forming the depletion layer alleviation region 30, it is possible to adopt irradiation of baryons such as protons, $^3$He$^{++}$ and $^4$He$^{++}$. Among them, the protons having a small mass can be introduced to have a wide distribution in the thickness direction and, therefore, are suitable for use in forming a thick depletion layer alleviation region 30. The protons can be converted to donors by heat treatment at a relatively low temperature (e.g., at 350 to 450 degrees Celsius). Therefore, the irradiation of the protons and the conversion to donors thereof (the heat treatment) can be performed, e.g., before and after the formation of the drain electrode 28 or the like. Accordingly, use of the protons helps increase the degree of freedom of the process.

The arrangement of the depletion layer alleviation region 30 shown in FIG. 6 and the arrangement of the trap level region 32 shown in FIG. 5 can be combined arbitrarily.

Figure 7:
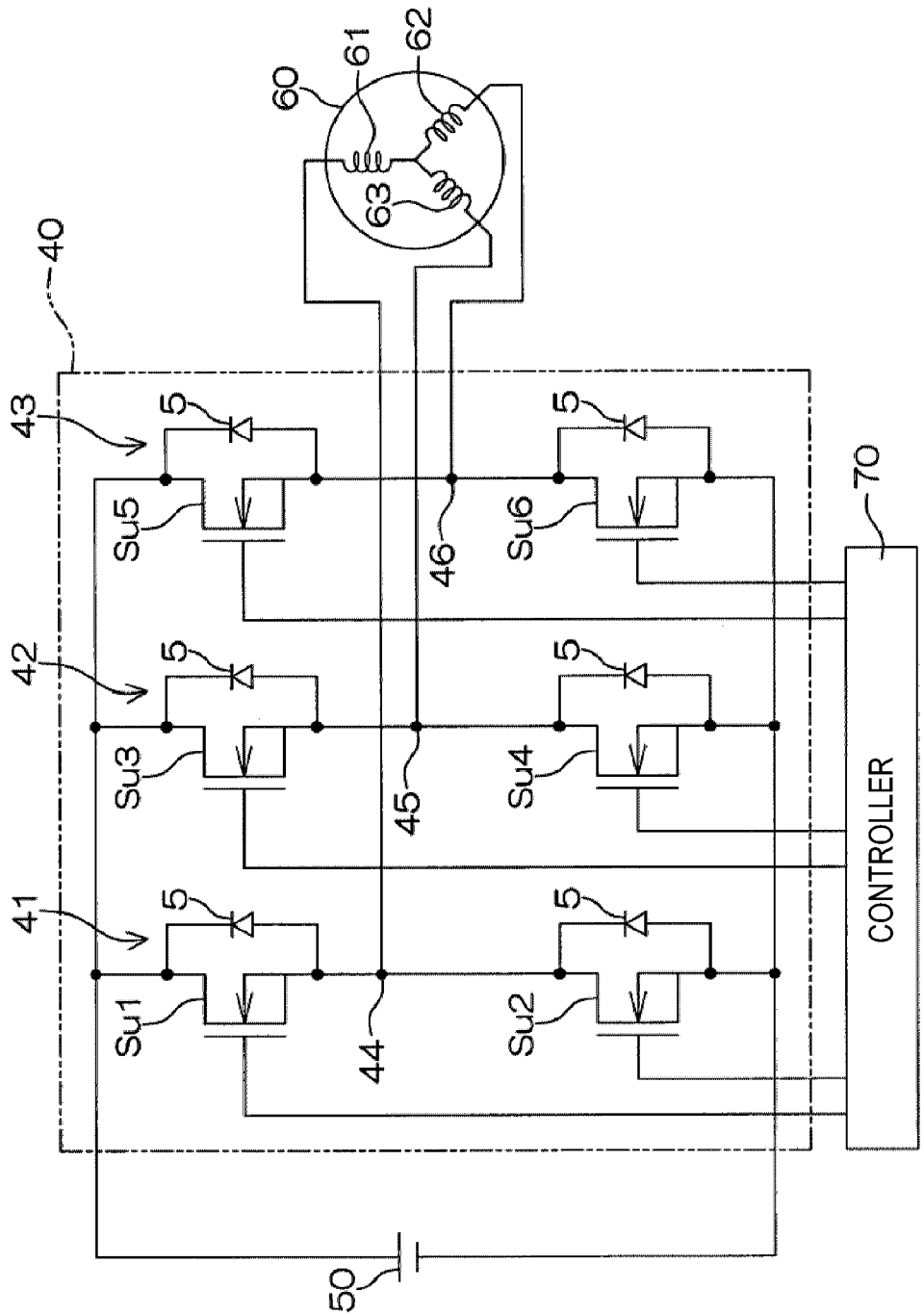
FIG. 7 is an electric circuit diagram for explaining a configuration of a power module in which the semiconductor device is used as a switching element.

FIG. 7 is an electric circuit diagram for explaining the configuration of a power module in which the semiconductor device 1 is used as a switching element. The power module 40 makes up a motor drive circuit (an inverter circuit) for driving a three-phase alternating current electric motor 60 (one example of inductive loads) with the electric power supplied from a battery 50 as a direct current source. The electric motor 60 can be used in, e.g., driving a fan, a compressor or the like.

The power module 40 includes a U-phase serial circuit 41, a V-phase serial circuit 42 and a W-phase serial circuit 43 corresponding to a U-phase, a V-phase and a W-phase of the electric motor 60, respectively. These serial circuits 41, 42 and 43 are parallel-connected to the current source 50. The serial circuits 41, 42 and 43 of these three phases may be accommodated in a single housing. The U-phase serial circuit 41 is formed by serially connecting a high-side switching element Su1 and a low-side switching element Su2. A connection point 44 between the switching elements Su1 and Su2 is connected to a U-phase coil 61 of the electric motor 60. Similarly, the V-phase serial circuit 42 is formed by serially connecting a high-side switching element Su3 and a low-side switching element Su4. A connection point 45 between the switching elements Su3 and Su4 is connected to a V-phase coil 62 of the electric motor 60. Likewise, the W-phase serial circuit 43 is formed by serially connecting a high-side switching element Su5 and a low-side switching element Su6. A connection point 46 between the switching elements Su5 and Su6 is connected to a W-phase coil 63 of the electric motor 60.

Each of the switching elements Su1 through Su6 is formed of the semiconductor device 1 set forth above. The parasitic diode 5 of each of the switching elements Su1 through Su6 is reversely connected to the battery 50. A control signal from a controller 70 is inputted to a gate of each of the switching elements Su1 through Su6. The control signal may be a PWM (pulse width modulation) signal having a duty ratio corresponding to an electric power to be supplied to the electric motor 60.

The controller 70 serves as an on-off control for the switching elements Su1 through Su6 depending on a rotation angle (an electric angle) of a rotor of the electric motor 60. Thus, the rotor of the electric motor 60 generates torque. Coils 61 through 63 of the electric motor 60 generate a counter electromotive force upon interruption of the electric power. Due to the counter electromotive force, the parasitic diode 5 of each of the switching elements Su1 through Su6 is turned on, thereby generating a time period during which a current flows through the parasitic diode 5. In other words, the parasitic diode 5 is turned on and off while the electric motor 60 is driven. For instance, in any one of the serial circuits 41, 42 and 43, there may be a case where the high-side switching element is in an on-state and the parasitic diode 5 of the low-side switching element is also in an on-state. When the parasitic diode 5 of the low-side switching element is turned off with the high-side switching element kept in the on-state, a through-current flows due to a reverse recovery current.

Figure 8A:
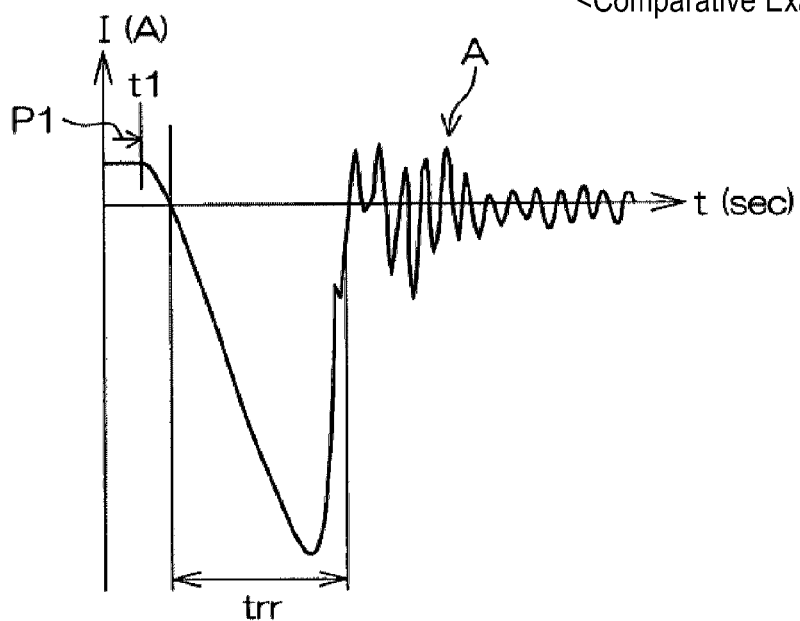
FIGS. 8A through 8C are waveform diagrams showing different examples of a current waveform when a parasitic diode is turned off from an on-state, FIG. 8A showing a current waveform in an instance where neither the depletion layer alleviation region nor the trap level region is provided (Comparative Example 1), FIG. 8B showing a current waveform in an instance where the depletion layer alleviation region is not provided and the trap level region is provided (Comparative Example 2), FIG. 8C showing a current waveform in an instance where both the depletion layer alleviation region and the trap level region are provided (Example).
Figure 8B:
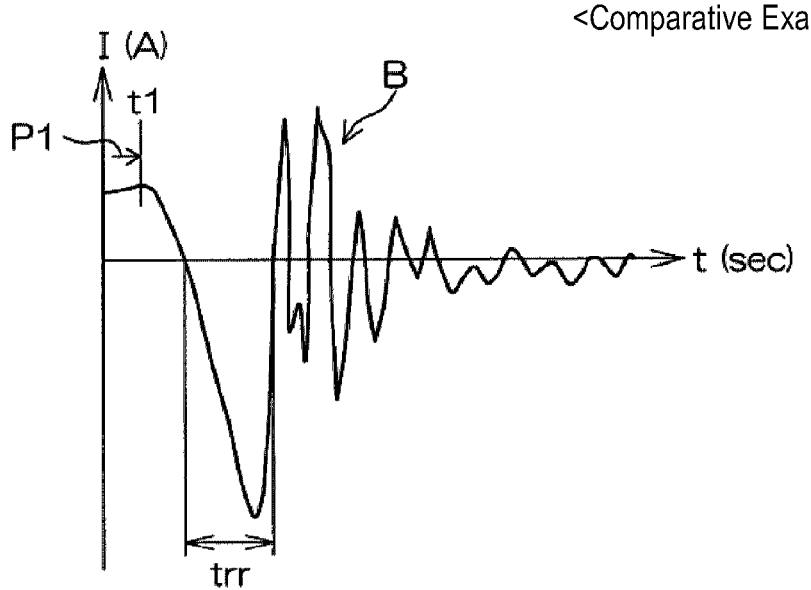
Figure 8C:
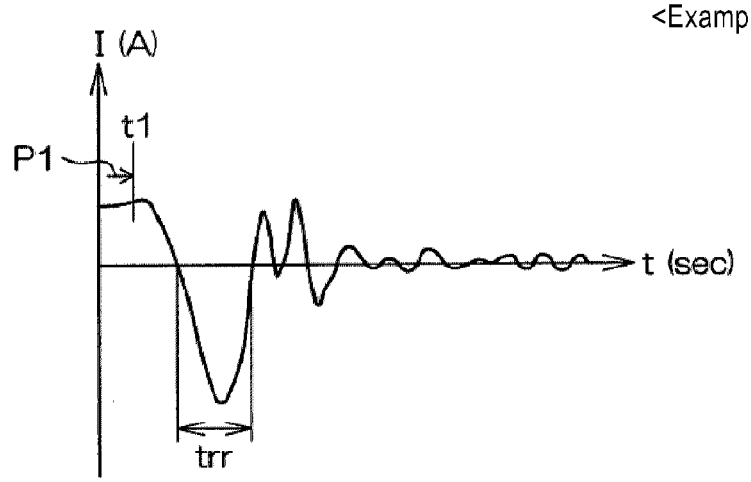

FIGS. 8A through 8C are waveform diagrams showing different examples of waveforms of a current flowing between the source electrode 26 and the drain electrode 28 when the parasitic diode 5 is turned off from the on-state. FIG. 8A shows a current waveform in an instance where neither the depletion layer alleviation region 30 nor the trap level region 32 is provided (Comparative Example 1). FIG. 8B shows a current waveform in an instance where the depletion layer alleviation region 30 is not provided and the trap level region 32 is provided (Comparative Example 2). FIG. 8C shows a current waveform in an instance where both the depletion layer alleviation region 30 and the trap level region 32 are provided (Example).

During time period P1, the parasitic diode 5 remains conductive such that a current flows in a forward direction of the parasitic diode 5. If the source electrode 26 becomes lower in electric potential than the drain electrode 28 at time t1, the parasitic diode 5 comes into a reverse bias state and gets turned off. At this turning-off time, a depletion layer is expanded from the p-n junction portion of the parasitic diode 5. Thus, the carriers (positive holes) within the p-type base layer 16 and the p-type column layer 14 migrate toward the source electrode 26, and the carriers (electrons) within the n-type base layer 12 migrate toward the drain electrode 28. Due to this migration of the carriers, a current (a reverse recovery current) flows in an opposite direction to the current flowing direction when the parasitic diode 5 is in an off-state. The reverse recovery current is initially increased (in absolute value) and then decreased. As stated earlier, the time required for the intensity of the reverse recovery current to decrease to 10% of the maximum value after the forward current of the diode becomes zero is a reverse recovery time trr.

The trap level region 32 reduces the number of migrating carriers, which helps reduce the reverse recovery current and the reverse recovery time trr. For that reason, the reverse recovery time trr is shorter in Comparative Example 2 shown in FIG. 8B and in the Example shown in FIG. 8C than in Comparative Example 1 shown in FIG. 8A. More specifically, the reverse recovery time trr in Comparative Example 1 shown in FIG. 8A is about 160 nanoseconds, the reverse recovery time trr in Comparative Example 2 shown in FIG. 8B is about 80 nanoseconds, and the reverse recovery time trr in the Example shown in FIG. 8C is about 90 nanoseconds.

The depletion layer alleviation region 30 reduces an expansion speed of the depletion layer, thereby reducing the changing speed of the reverse recovery current (di/dt). More specifically, the rate of change of the reverse recovery current is reduced after the reverse recovery current is turned to reduction (in absolute value). In other words, the rate of change of the reverse recovery current after the reverse recovery current is turned to reduction is smaller in the Example shown in FIG. 8C than in Comparative Example 1 shown in FIG. 8A and Comparative Example 2 shown in FIG. 8B. Thus, the current rapidly converges to zero in the Example shown in FIG. 8C.

In the Example shown in FIG. 8C, the reverse recovery current smoothly converges to zero as set forth above, which makes it possible to solve the problem of hard recovery. In other words, it is possible to reduce the ringing (vibration of the reverse recovery current) as indicated by reference symbols A and B in FIGS. 8A and 8B and the noise generated by the sharp change of the current. As a result of the reduction of noise, it becomes possible to reduce the erroneous operation of the controller 70 and to stably control the electric motor 60.

Figure 9A:
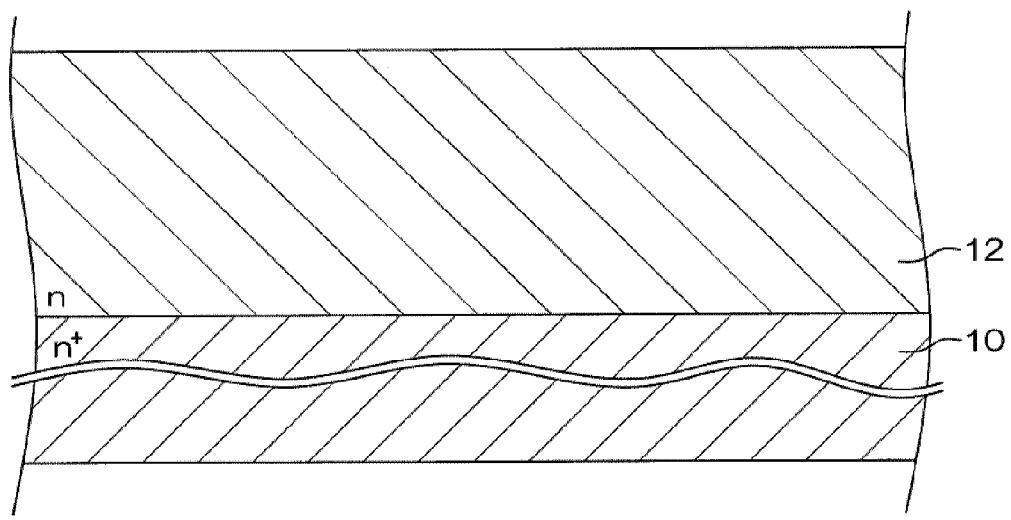
FIG. 9A is a section view showing the semiconductor device under a manufacturing process.
Figure 9B:
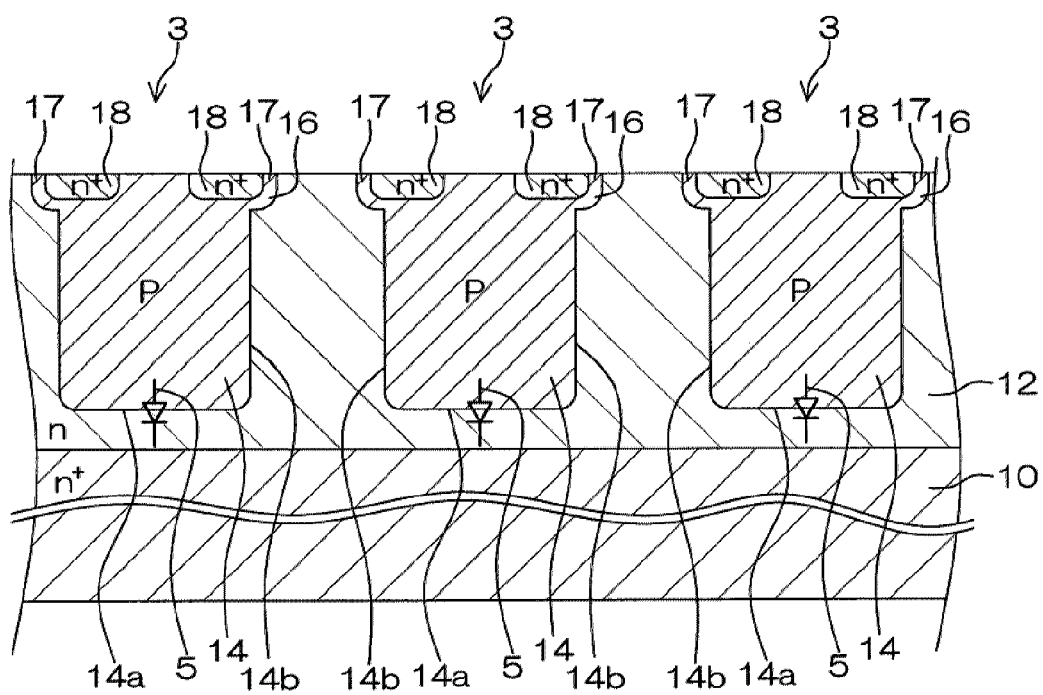
FIG. 9B is a section view showing the next step of the step shown in FIG. 9A.

FIGS. 9A through 9F are section views illustrating a process of manufacturing the semiconductor device 1. Referring first to FIG. 9A, the n-type base layer 12 greater in resistance (lower in impurity concentration) than the n$^+$-type drain layer 10 is formed on the n$^+$-type drain layer 10 made from, e.g., an n$^+$-type silicon substrate, by epitaxial growth which is performed while doping an n-type impurity. Then, as illustrated in FIG. 9B, p-type impurity ions are selectively implanted into the surface layer portion of the n-type base layer 12 with a relatively low level of energy, thereby forming the p-type base layer 16. P-type impurity ions are selectively implanted into a predetermined plan-view region within the p-type base layer 16 with a relatively high level of energy, consequently forming the p-type column layer 14 that extends to a region deeper than the p-type base layer 16. N-type impurity ions are selectively implanted into an annular region of specified width having an outer edge portion in a position inwardly deviated by a specified distance from the outer edge of the p-type base layer 16 in the p-type base layer 16 as seen in a plan view, thereby forming the n$^+$-type source layer 18.

Figure 9C:
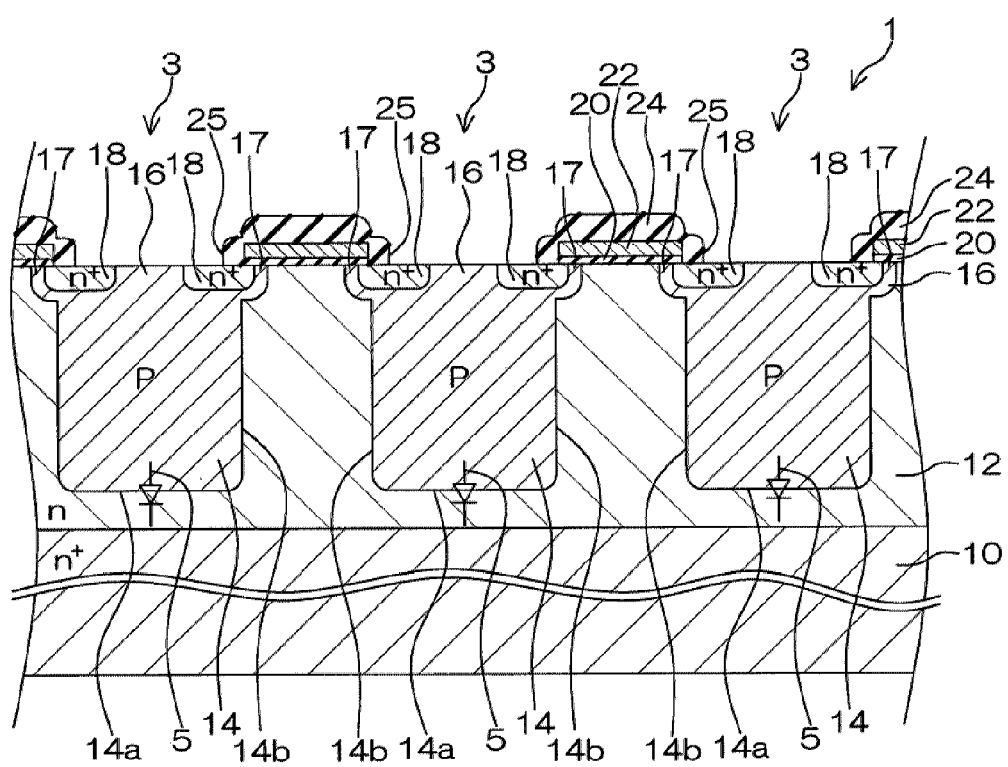
FIG. 9C is a section view showing the next step of the step shown in FIG. 9B.

Next, as illustrated in FIG. 9C, the gate insulation film 20 is formed to cover the surfaces of the n-type base layer 12 and the p-type base layer 16 (the surfaces of semiconductor crystals). The gate insulation film 20 may be formed by thermally oxidizing the semiconductor crystal surfaces. The gate electrode 22 is formed on the gate insulation film 20. The formation of the gate electrode 22 may be performed by, e.g., forming a polysilicon film, the resistance of which is reduced by addition of an impurity, on the whole surface and then selectively etching the polysilicon film by photolithography. In the etching step, the gate electrode 22 and the gate insulation film 20 may be formed with the same pattern by simultaneously patterning the gate electrode 22 and the gate insulation film 20. Then, the interlayer insulation film 24 is formed to cover the gate electrode 22. The contact hole 25 is formed in the interlayer insulation film 24 by photolithography.

Figure 9D:
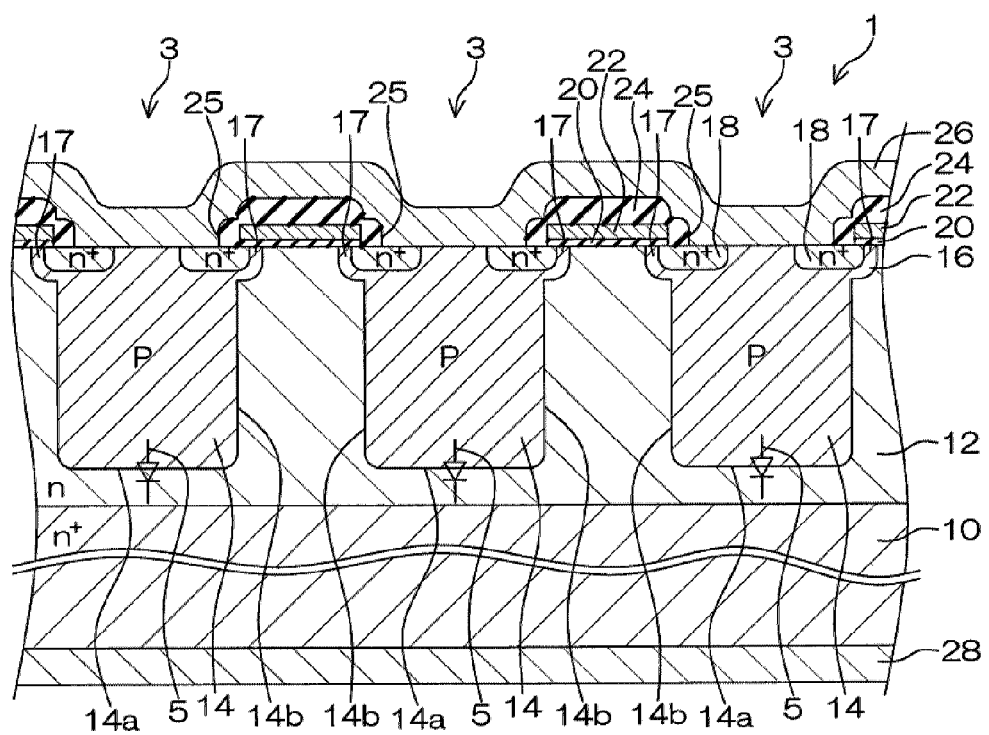
FIG. 9D is a section view showing the next step of the step shown in FIG. 9C.

Next, as illustrated in FIG. 9D, the source electrode 26 is formed on the interlayer insulation film 24, and the drain electrode 28 is formed on the rear surface of the drain layer 10. Thereafter, if necessary, heat treatment is performed to form an ohmic junction through an alloying process. The formation of the drain electrode 28 may be performed by, e.g., a process in which a base layer (an ohmic junction layer) of the drain electrode 28 is formed by vapor deposition of gold and antimony. In this case, the heat treatment for the ohmic junction may be performed at a temperature of, e.g., about 420 degrees Celsius. An Au—Si eutectic can be formed by the heat treatment.

Figure 9E:
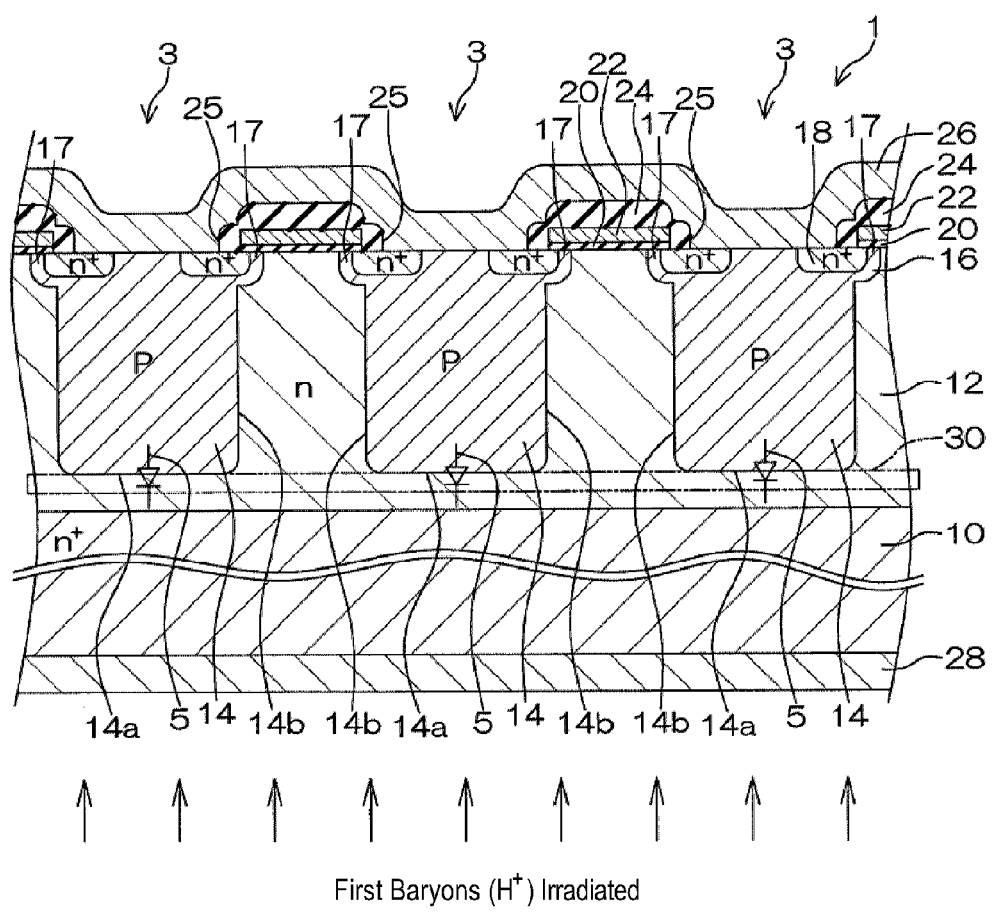
FIG. 9E is a section view showing the next step of the step shown in FIG. 9D.

Subsequently, as illustrated in FIG. 9E, first baryon irradiation is performed at the side of the drain layer 10. As the baryons (first baryons) irradiated at this time, it is possible to use baryons having a relatively small mass, e.g., protons. Thereafter, low-temperature heat treatment (low-temperature annealing) is carried out. Thus, the irradiated baryons are converted to donors. When protons are selected as the baryons, the introduced protons can be converted to donors by, e.g., performing heat treatment at about 350 to 450 degrees Celsius (e.g., 360 degrees Celsius) for about 30 to 90 minutes (e.g., 60 minutes). If the alloying of the source electrode 26 and the drain electrode 28 is simultaneously performed by heat treatment at this time, the heat treatment to be carried out after the formation of the source electrode 26 and the drain electrode 28 may be omitted.

In this manner, the depletion layer alleviation region 30 is formed by the irradiation of the first baryons and the subsequent heat treatment. If the level of energy during the irradiation of the first baryons is high, the range of the first baryons becomes longer and, therefore, the depletion layer alleviation region 30 is formed in a position distant from the rear surface of the drain layer 10. If the level of energy during the irradiation of the first baryons is low, the range of the first baryons becomes shorter and, therefore, the depletion layer alleviation region 30 is formed in a position close to the rear surface of the drain layer 10. In view of this, the irradiation energy of the first baryons is set depending on a placement of the depletion layer alleviation region 30. The irradiation energy of the first baryons is set (to, e.g., about 8 MeV) such that at least a portion of the depletion layer alleviation region 30 is positioned between the bottom surface 14$a$ of the p-type column layer 14 and the drain layer 10. The dose amount of the first baryons (e.g., protons) is in some embodiments set to, e.g., about $5\times10^{13}$ baryons/cm$^2$ to $1\times10^{14}$ baryons/cm$^2$.

Figure 9F:
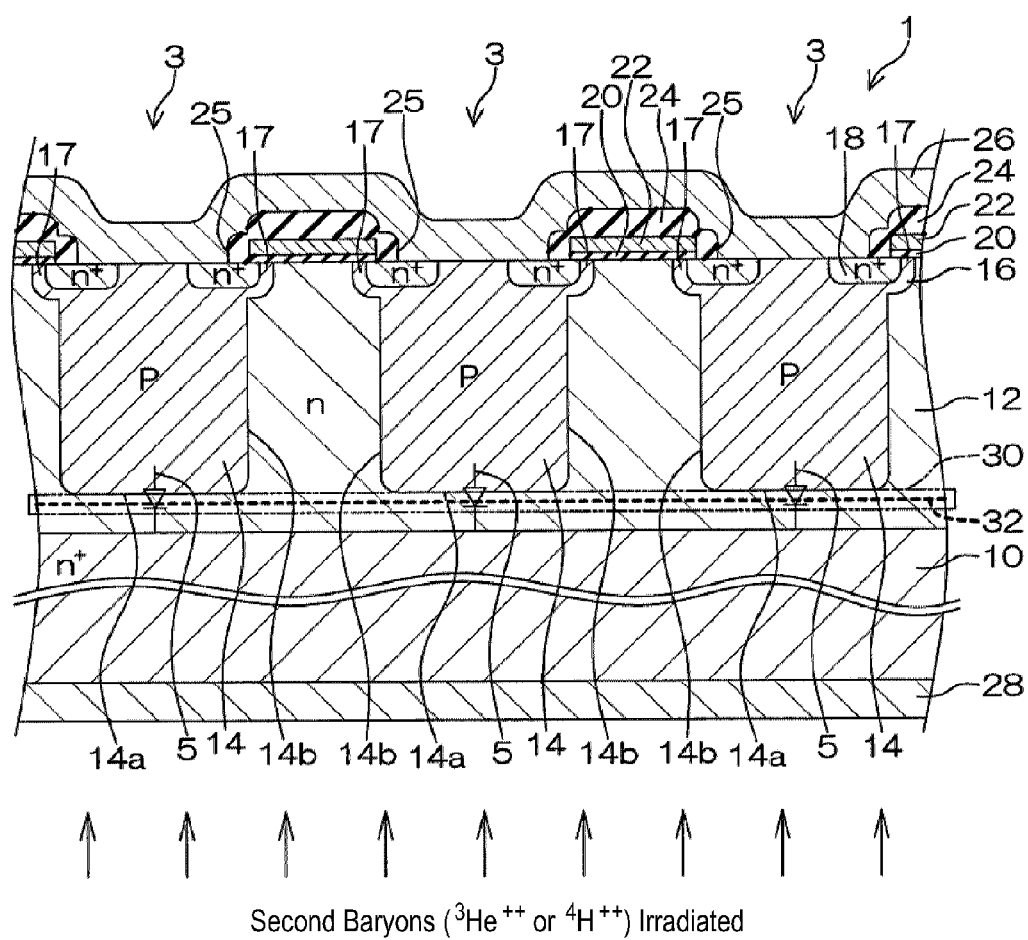
FIG. 9F is a section view showing the next step of the step shown in FIG. 9E.

Next, as illustrated in FIG. 9F, second baryon irradiation is performed at the side of the drain layer 10. As the baryons (second baryons) are irradiated at this time, it is possible to use baryons having a relatively large mass, e.g., helium nuclei ($^3$He$^{++}$ or $^4$He$^{++}$). Thereafter, low-temperature heat treatment (low-temperature annealing) is carried out, whereby the irradiated second baryons are activated. When helium nuclei ($^3$He$^{++}$ or $^4$He$^{++}$) are selected as the second baryons, the introduced helium nuclei can be activated by, e.g., performing heat treatment at about 320 to 380 degrees Celsius (e.g., 350 degrees Celsius) for about 30 to 120 minutes (e.g., 60 minutes).

In this manner, the trap level region 32 is formed. If the level of energy during the irradiation of the second baryons is high, the range of the second baryons becomes longer and, therefore, the trap level region 32 is formed in a position distant from the rear surface of the drain layer 10. If the level of energy during the irradiation of the second baryons is low, the range of the second baryons becomes shorter and, therefore, the trap level region 32 is formed in a position close to the rear surface of the drain layer 10. In view of this, the irradiation energy of the second baryons is set depending on the placement of the trap level region 32. For example, the irradiation energy of the second baryons is set (to, e.g., about 23 MeV) such that the trap level region 32 is positioned between the bottom surface 14$a$ of the p-type column layer 14 and the drain layer 10. The dose amount of the second baryons is in some embodiments set to, e.g., about $5\times10^{10}$ baryons/cm$^2$ to $5\times10^{12}$ baryons/cm$^2$.

Thereafter, if necessary, a surface layer of the drain electrode 28 is formed on a base layer (e.g., the gold-antimony layer) of the drain electrode 28. The surface layer may be a laminated film formed by laminating Ti/Ni/Au/Ag layers one above another on the base layer. The laminated film can be continuously formed by a sputtering method. The melting points of the metals of the respective layer making up the laminated film are higher than the temperature of the heat treatment for the conversion to donors of the protons and for the activation of the helium nuclei. Thus, from the viewpoint of physics, no problem is posed even if the formation of the laminated film is performed prior to the heat treatment for the conversion to donors of the protons and for the activation of the helium nuclei. In the present embodiment, however, the formation of the surface layer is performed after the heat treatment for the conversion to donors of the protons and for the activation of the helium nuclei so that a thermal history should not remain in the surface layer formed of the laminated film.

The semiconductor device 1 shown in FIG. 1 and other figures is manufactured in the manner described above.

In the semiconductor device 1 of the present embodiment described above, the p-type column layer 14 extends from the p-type base layer 16 toward the $n^+$-type drain layer 10 and makes up a MISFET having a super junction structure. This makes it possible to provide a switching element having a low on-resistance and an increased switching speed. In the semiconductor device 1, the depletion layer alleviation region 30 is arranged between the p-type column layer 14 and the $n^+$-type drain layer 10 within the p-type base layer 16. The depletion layer alleviation region 30 includes baryons converted to donors. The depletion layer alleviation region 30 restrains a depletion layer from expanding toward the $n^+$-type drain layer 10, thereby reducing the expansion speed of the depletion layer when the parasitic diode 5 is turned off. This reduces the changing speed of a reverse recovery current and, therefore, improves the recovery characteristics. Accordingly, it is possible to provide a MISFET which is good in on-resistance and switching speed and superior in recovery characteristics.

In the semiconductor device 1 of the present embodiment, the trap level region 32 containing baryons for formation of a trap level is formed within the n-type base layer 12. The trap level region 32 serves to trap carriers (electrons) migrating within the n-type base layer 12, thereby reducing the reverse recovery current. Accordingly, the depletion layer alleviation region 30 can improve the recovery characteristics while the trap level region 32 can shorten the reverse recovery time trr.

In the semiconductor device 1 of the present embodiment, the thickness of the depletion layer alleviation region 30 is greater than the thickness of the trap level region 32. Since the trap level is locally distributed within a limited extent, it is possible to shorten the reverse recovery time while reducing the leak current. Inasmuch as the depletion layer alleviation region 30 is formed within the n-type base layer 12 over a relatively wide range in the area between the p-type column layer 14 and the $n^+$-type drain layer 10, it is possible to effectively reduce the expansion speed of the depletion layer and, hence, to effectively improve the recovery characteristics.

When protons are selected as the first baryons, the conversion to donors thereof can be performed through heat treatment at a relatively low temperature (e.g., 350 to 450 degrees Celsius). For that reason, the heat treatment can be carried out after the formation of the source electrode 26 and/or the drain electrode 28. Accordingly, the degree of freedom of the process grows higher. If the boundary of the depletion layer alleviation region 30 coincides with or remains close (by a distance of, e.g., 5 μm or less) to the boundary of the p-type column layer 14, the speed at which the depletion layer expands from the p-type column layer 14 can be reduced without eroding the p-type column layer 14. This makes it possible to improve the recovery characteristics without impairing the effect provided by the super junction structure.

In the power module 40 in which the semiconductor device 1 having the super junction structure is used as the high-side switching elements Su1. Su3 and Su5 and the low-side switching elements Su2, Su4 and Su6, the power loss in the switching elements Su1 through Su6 remains low, which leads to increased power supply efficiency. Since the hard recovery occurring when the parasitic diodes 5 of the switching elements Su1 through Su6 are turned off is restrained, it is possible to reduce the erroneous operation of the controller 70 for supplying a control signal to the switching elements Su1 through Su6.

While one embodiment of the present disclosure has been described above, the present disclosure can be embodied in many different forms. For example, although protons are used as the first baryons and helium nuclei are used as the second baryons in the embodiment described above, the combination of the baryons is not limited thereto. More specifically, protons, $^3He^{++}$ and $^4He^{++}$ presented as examples of the first baryons and protons, $^3He^{++}$ and $^4He^{++}$ presented as examples of the second baryons can be used in arbitrary combinations.

Although the formation of the depletion layer alleviation region 30 and the formation of the trap level region 32 through the irradiation of the first baryons and the second baryons are performed after the electrode formation step (see FIG. 9D) in the embodiment described above, one or both of them may be performed prior to the electrode formation step. In this case, however, the temperature of heat treatment for the electrode formation (alloying process for the formation of ohmic contacts) needs to be lower than the temperature of heat treatment for the formation of the depletion layer alleviation region 30 and/or the trap level region 32.

While the structure and manufacturing method of the semiconductor device 1 including both the depletion layer alleviation region 30 and the trap level region 32 has been presented in the embodiment described above, the trap level region 32 may be omitted as far as only hard recovery needs to be improved. While the power module 40 including the serial circuits of three phases 41 through 43 for driving the three-phase alternating current electric motor 60 has been presented in the embodiment described above, a serial circuit of one phase (a serial circuit of a high-side switching element and a low-side switching element) may be accommodated in a single housing as a unit of a power module. In this case, a motor drive circuit for the three-phase alternating current electric motor 60 can be formed by parallel-connecting power modules of three units. If the electric motor to be driven is not a three-phase motor, a motor drive circuit can be formed by parallel-connecting power modules whose unit number corresponds to the phase number of the electric motor.

While the electric motor has been presented as one example of inductive loads in the embodiment described above, the present disclosure may be applied to a power module for driving other inductive loads such as a relay and a solenoid. Moreover, the present disclosure may be applied not only to the power module for driving inductive loads but also to a direct inverter for driving a backlight of a liquid crystal television set, a power conditioner for photovoltaic power generation, and so forth. It goes without saying that the present semiconductor device can be applied not only to the inverter circuit but also to a circuit having a fast-driven switching element, e.g., a converter circuit.

While the p-type base layer 16 and other layers are formed into a rectangular plan-view shape (see FIG. 3) or a hexagonal plan-view shape (see FIG. 4) in the embodiment described above, the plan-view shape of the p-type base layer 16 and other layers is not limited thereto but may be circular, elliptical, pentagonal or other polygonal shape. In addition, the present disclosure can be modified to many different designs without departing from the scope of the disclosure defined in the claims.

While certain embodiments have been described, these embodiments have been presented by way of example only, and are not intended to limit the scope of the disclosures. Indeed, the novel semiconductor device and method of manufacturing the same described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming an n-type base layer on an n-type drain layer;
    partially forming a p-type base layer in a surface layer portion of the n-type base layer;
    partially forming an n-type source layer in a surface layer portion of the p-type base layer;
    forming a p-type column layer formed within the n-type base layer to extend from the p-type base layer toward the n-type drain layer;
    forming a gate insulation film on a surface of the p-type base layer between the n-type source layer and the n-type base layer;
    forming a gate electrode on the gate insulation film to face, through the gate insulation film, the surface of the p-type base layer between the n-type source layer and the n-type base layer;
    forming a source electrode electrically connected to the n-type source layer;
    forming a drain electrode electrically connected to the n-type drain layer; and
    forming a depletion layer alleviation region arranged between the p-type column layer and the n-type drain layer so as to be within the n-type base layer by irradiating first baryons at a rear surface side of the n-type drain layer and then converting the first baryons to donors through heat treatment at a predetermined temperature;
    forming a trap level region including second baryons locally formed within the depletion layer alleviation region, the second baryons being heavier than the first baryons.

2. The method of claim 1, further comprising:
    forming the trap level region within the n-type base layer by irradiating the second baryons at the rear surface side of the n-type drain layer.

3. The method of claim 2, wherein the trap level region is locally formed within the depletion layer alleviation region.

4. The method of claim 2, wherein the depletion layer alleviation region and the trap level region are formed such that the depletion layer alleviation region has a thickness greater than a thickness of the trap level region.

5. The method of claim 2, wherein the second baryons comprise one member selected from the group consisting of protons, $^3\text{He}^{++}$ and $^4\text{He}^{++}$.

6. The method of claim 1, wherein the first baryons comprise one member selected from the group consisting of protons, $^3\text{He}^{++}$ and $^4\text{He}^{++}$.

7. The method of claim 1, wherein the first baryons comprise protons.

8. The method of claim 1, wherein the depletion layer alleviation region is formed to have an area overlapping with the p-type column layer.

9. The method of claim 1, wherein the depletion layer alleviation region is formed not to have an area overlapping with the p-type column layer.

10. The method of claim 1, wherein the depletion layer alleviation region is formed to be adjacent to the p-type column layer.

11. The method of claim 1, wherein the depletion layer alleviation region is formed to be separated from the p-type column layer.

12. A method of manufacturing a power module, comprising:
    forming a high-side switching element formed of a semiconductor device manufactured by the method of claim 1; and
    forming a low-side switching element formed of a semiconductor device manufactured by the method of claim 1, the high-side switching element and the low-side switching element being serially connected to each other.

13. The method of claim 12, wherein the high-side switching element comprises high-side switching elements and the low-side switching element includes low-side switching elements, the method further comprising:
    forming a three serial circuits, each including one of the high-side switching elements, and one of the low-side switching elements that are serially connected to each other, the three serial circuits being parallel-connected to one another.

14. The method of claim 12, wherein the power module is used to supply a drive current to an alternating current electric motor.

* * * * *